United States Patent [19]
Brooks et al.

[11] Patent Number: 5,506,754
[45] Date of Patent: Apr. 9, 1996

[54] THERMALLY MATCHED ELECTRONIC COMPONENTS

[75] Inventors: Mark Brooks; Gary Seibel, both of North Mankato, Minn.

[73] Assignee: Thin Film Technology Corp., North Mankato, Minn.

[21] Appl. No.: 267,535

[22] Filed: Jun. 29, 1994

[51] Int. Cl.$^6$ .................................................. H05K 7/20
[52] U.S. Cl. .......................... 361/719; 361/720; 361/722
[58] Field of Search .............................. 174/16.3, 52.4, 174/252; 257/713, 787, 794; 361/704, 707, 708, 714–722, 784, 744, 820

[56] References Cited

U.S. PATENT DOCUMENTS

| | | | |
|---|---|---|---|
| 4,689,110 | 8/1987 | Leibowitz | 361/708 |
| 4,764,846 | 8/1988 | Go | 361/708 |
| 4,774,632 | 9/1988 | Neugebauer | 361/715 |
| 4,983,533 | 1/1991 | Go | 361/708 |
| 5,222,014 | 6/1993 | Lin | 361/414 |
| 5,239,198 | 8/1993 | Lin et al. | 257/693 |
| 5,313,365 | 5/1994 | Pennisi et al. | 361/760 |

*Primary Examiner*—Gregory D. Thompson
*Attorney, Agent, or Firm*—D. L. Tschida

[57] ABSTRACT

Discrete circuit devices constructed on a component substrate thermally matched to the supporting substrate of a higher level circuit assembly. Upon securing each component to the supporting substrate of a higher level circuit assembly, a connection subject to reduced thermal stress is obtained. In the construction of an exemplary surface mount, hybrid component containing resistors and capacitors, a component substrate of a polyimide impregnated material is populated with a repeating matrix of chip capacitors and chip resistors, which are adhesively bound and soldered to selected termination pads containing high temperature solder filled through vias. The substrate is epoxy encapsulated and then diced at selected ones of the through vias into multiple components. Each thermally matched component is resoldered at the separated vias to obtain surface mount terminations. Portions of the vias may be exposed through the component sidewall to permit circuit test. Other, exemplary thermally matched components, constructed of multilayer resin or ceramic substrates are also disclosed and wherein external termination pads are concentrated to the center of the component. Alternative, thermally matched transmission lines and resistor network circuits are also disclosed.

13 Claims, 9 Drawing Sheets

THERMALLY MATCHED ELECTRONIC COMPONENTS

BACKGROUND OF THE INVENTION

The present invention relates to electronic components and, in particular, to components constructed to thermally match a supporting substrate of a higher level circuit assembly.

The substrates of the components contemplated in the present invention are thermally matched to the substrate of the next higher level circuit assembly to which they are attached. Preferably, the thermal coefficient of expansion (TCE) of the component substrate matches the TCE of the higher level assembly substrate. Component terminations are formed at solder filled electrical junctions. The terminations may be located to reduce thermal stress at the component's connection to a higher level assembly. The terminations may also be partially exposed to permit component testing, once mounted.

Advantages accrue in a thermally dynamic environment due to reduced thermal stress to the thermally matched component at the termination interface. Final form factor flexibility is also provided by sizing the thermally matched component to dimensions required. Absence of leads and lead length afford low electrical inductance and hence higher frequency performance. Side terminations are available for electrical test and visual quality inspection.

Conventional higher level circuit assembly typically requires the separate handling and attachment of many lead frame piece part components to an impregnated resin printed circuit (PC) board. Assembly of these leaded components typically requires the separate fluxing, soldering, cleaning, aligning, molding, deflashing and curing of each part. Prior to assembly, many of these leaded components may also be subject to lead forming, lead cutting, fluxing, tinning, and cleaning. Co-planarity of populated leads is extremely important for reliable solder connections to the circuit board.

Component malfunctions or cracks may arise from thermal mismatches that occur at the point of electrical connection between the substrate of a higher level assembly and components populated about the assembly. Defects of these types arise because the substrate of available discrete, hybrid and integrated circuit components is normally formed from a material exhibiting a widely divergent TCE to that of the supporting substrate of a higher level circuit assembly. For example, the substrate of many integrated circuits and hybrid components are selected from various relatively heat transmissive materials versus the less transmissive material of the PC board, such as resin or polyimide impregnated boards. Over time, the relative differences in thermal expansion and contraction between each component substrate and supporting PC board can lead to a defective connection, cracks in the encapsulant, and malfunction. The potential for such defects increases as the physical size and number of component terminations increases.

The attendant lead frames and bonding conductors of a component can also effect the impedance characteristics of a populated higher level circuit assembly. Desirably, as few components as possible and components having short lead lengths or solder bump terminations are preferred over components having lead frames. Varieties of hybrid and integrated components can be used to this end. The electrical function and circuitry of the latter components can be tailored to the higher level assembly with which it is to be used.

In an exemplary hybrid thermally matched component containing resistors and capacitors, the invention offers simplicity in reduced parts count and reduced processing complexity during subsequent higher level circuit assembly. High frequency performance is enhanced at the higher level assembly with surface mount terminations.

Also disclosed are thermally matched, multi-layered transmission line components and thermally matched and resistive network circuit components.

All hybrid components are constructed to provide an optimal thermal match between each component and a support substrate of the higher level assembly, such as a hybrid ceramic carrier or resin or polyimide impregnated PC board. The invention, however, is adaptable to wide varieties of components.

SUMMARY OF THE INVENTION

It is a primary object of the invention to provide discrete thermally matched electronic circuit components which are constructed on a component substrate that is thermally matched to the support substrate of a higher level circuit assembly.

It is a further object of the invention to provide patterned electrical conductors or pathways, conductive via through features, and termination features on each component substrate.

It is a further object of the invention to populate the component substrate with discrete circuit devices that are assembled to the component substrate.

It is a further object of the invention to encapsulate the discrete circuit components in an encapsulant having a TCE matched to the component substrate.

It is a further object of the invention to construct multiple thermally matched components on a component substrate having a matched TCE, which substrate is populated with a number of lower level discrete circuit devices, and from which component substrate a number of thermally matched components are diced.

It is a further object of the invention to dice the components at oversized vias filled with a solder having a flow temperature greater than a solder used to solder the components to the higher level circuit assembly.

It is a further object of the invention to construct the circuit components in surface mount configurations.

It is a further object of the invention to provide multi-layer circuit components constructed of a variety of substrate materials having a TCE selected to match a higher level substrate.

It is a further object of the invention to consolidate and arrange included terminations for the discrete circuit devices at locations least affected by thermal differentials between the discrete circuit devices and a supporting substrate.

Various of the foregoing objects, advantages and distinctions of the invention are obtained in a presently preferred, thermally matched component of a hybrid component containing resistors and capacitors, a transmission line circuit, and a resistive network circuit.

In the hybrid resistive-capacitive termination circuit, a multiplicity of discrete circuit devices are formed at a hybrid populated, resin impregnated component substrate that is processed to include a multiplicity of conductive paths and termination pads. The conductive paths are printed and etched in a matrix arrangement. Plated through vias coincident with the conductive paths are formed and partially filled with a high temperature solder. The substrate is also printed with an adhesive and populated with discrete ceramic capacitors and resistors, before the capacitors and resistors are connected with a high temperature solder. The populated substrate is encapsulated in an encapsulant having a preferred TCE, before component substrate is diced at oversized ones of the solder filled through vias. Surface mount terminations are formed at resoldered terminations, after the component substrate is diced. Test regions are exposed through the diced solder filled vias at the component substrate to facilitate integrity testing of the component, once mounted to a higher level assembly.

In the transmission line and resistive network thermally matched components, multiple, printed film ceramic substrates containing aligned solder filled through vias are stacked and bonded to one another to provide electrical continuity. These perform as a discrete circuit component. Surface mount electrical termination pads are consolidated and arranged at the device to permit thermally independent flexion of the component substrates between each other and at the ends of the device.

Still other objects, advantages and distinctions of the invention will become more apparent from the following description with respect to the appended drawings. The description should not be literally construed in limitation of the invention. The scope of the invention should rather be interpreted in view of the further appended claims.

DESCRIPTION OF THE PREFERRED EMBODIMENT

Figure 1:
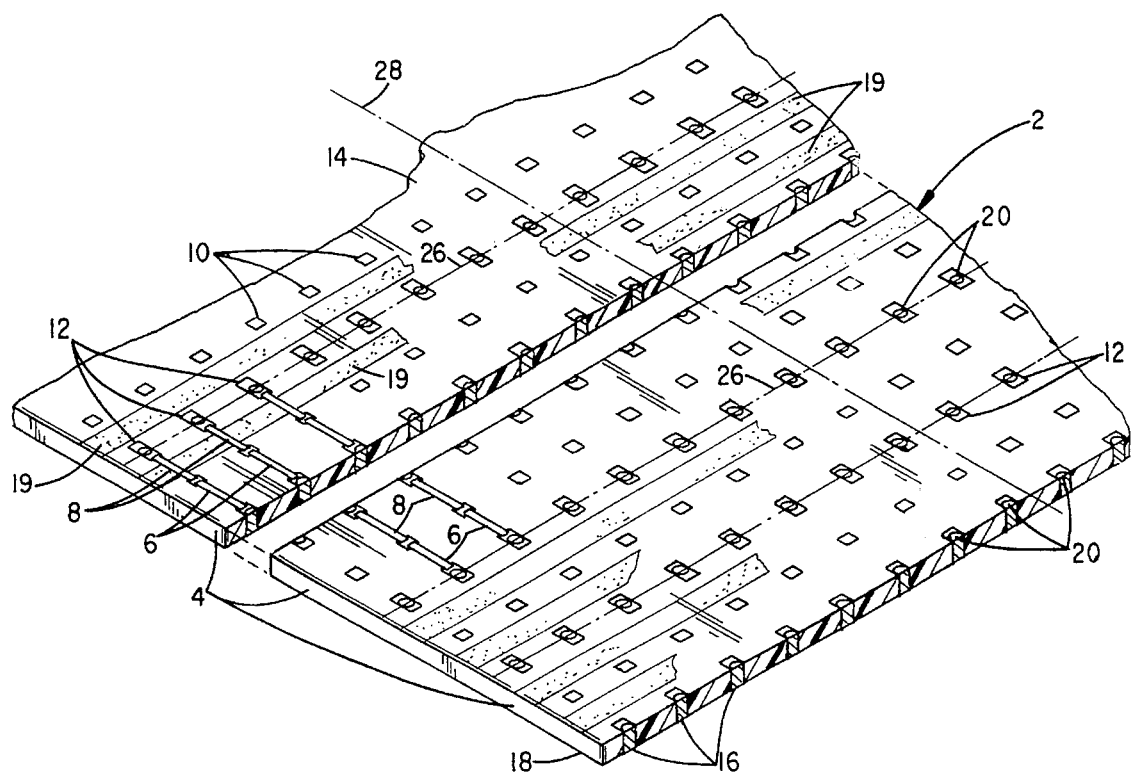
FIG. 1 is a perspective drawing shown in exploded assembly of a partially diced, hybrid populated assembly that forms a number of circuit components.
Figure 2:
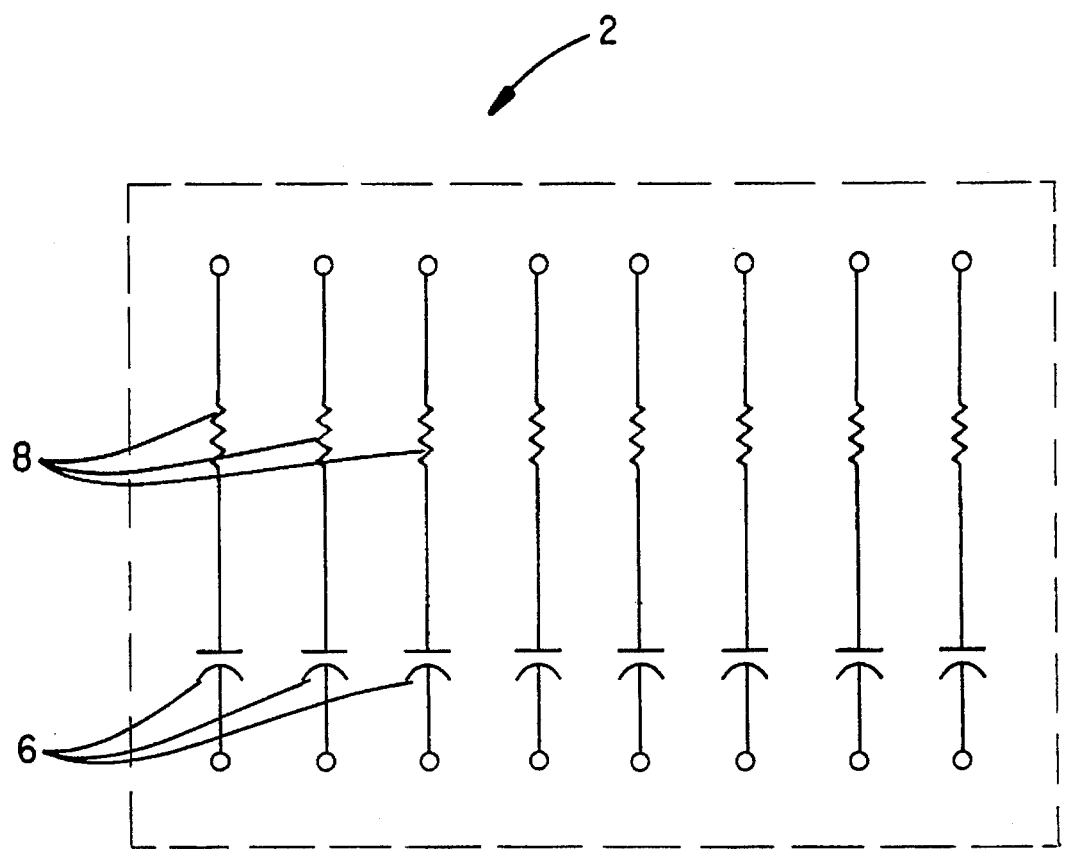
FIG. 2 is a schematic diagram of a termination circuit device constructed from the assembly of FIG. 1.
Figure 3:
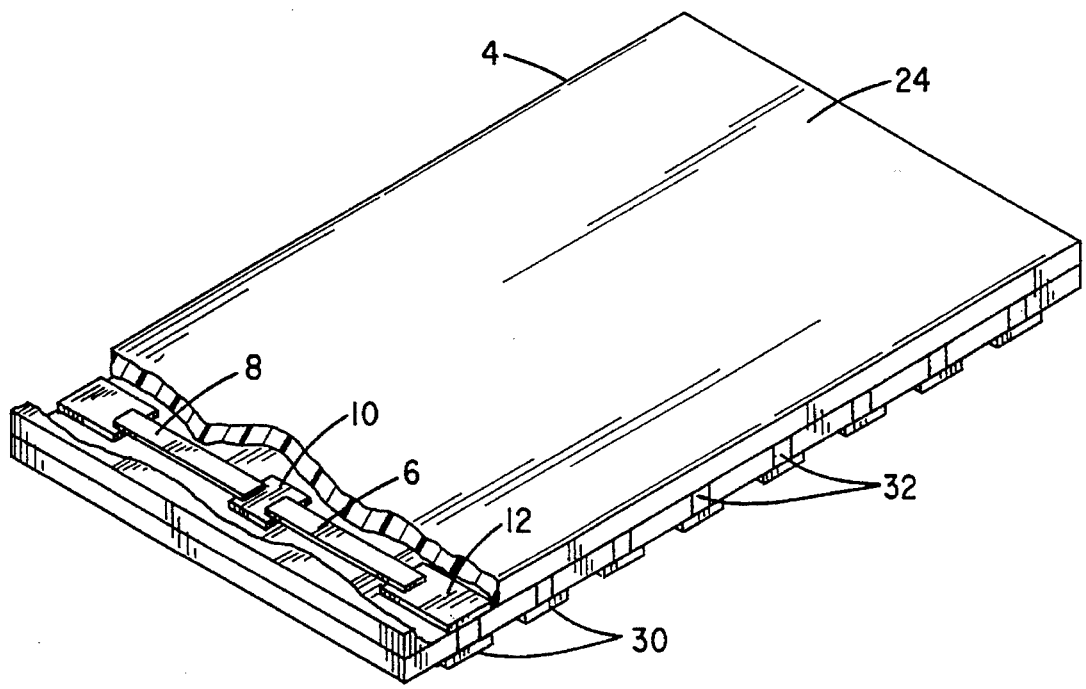
FIG. 3 is a perspective view shown in partial cutaway of a dual-in-line, surface mount device of FIG. 2.
Figure 4:
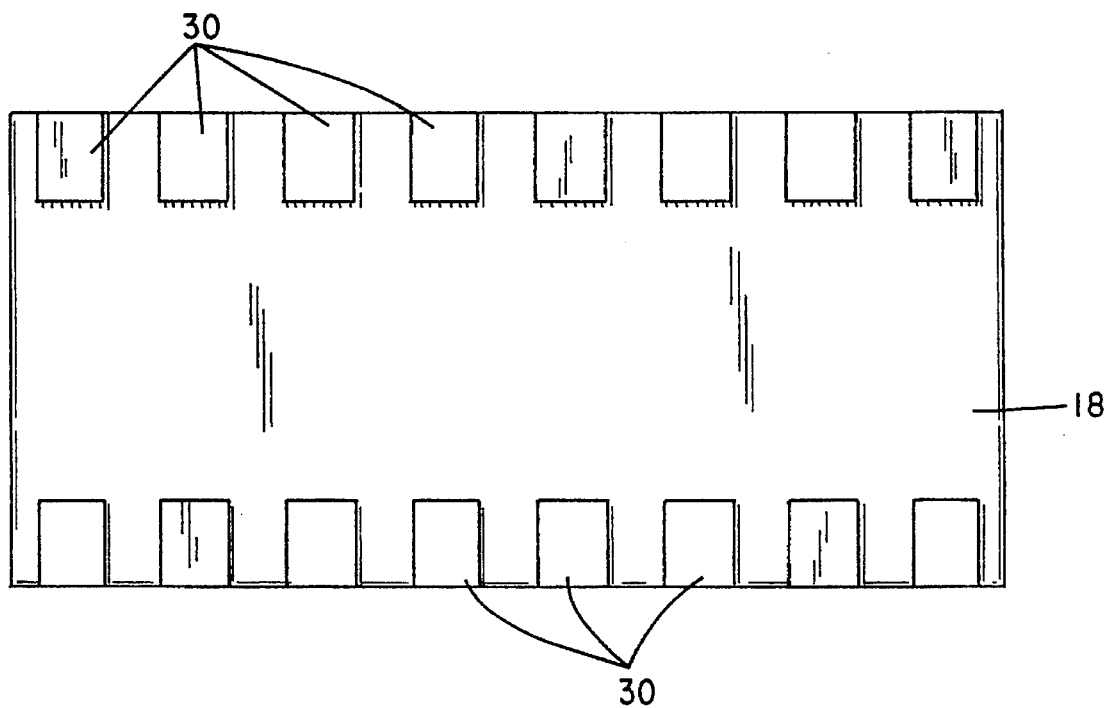
FIG. 4 is a bottom plan view of the circuit of FIG. 3.
Figure 5:
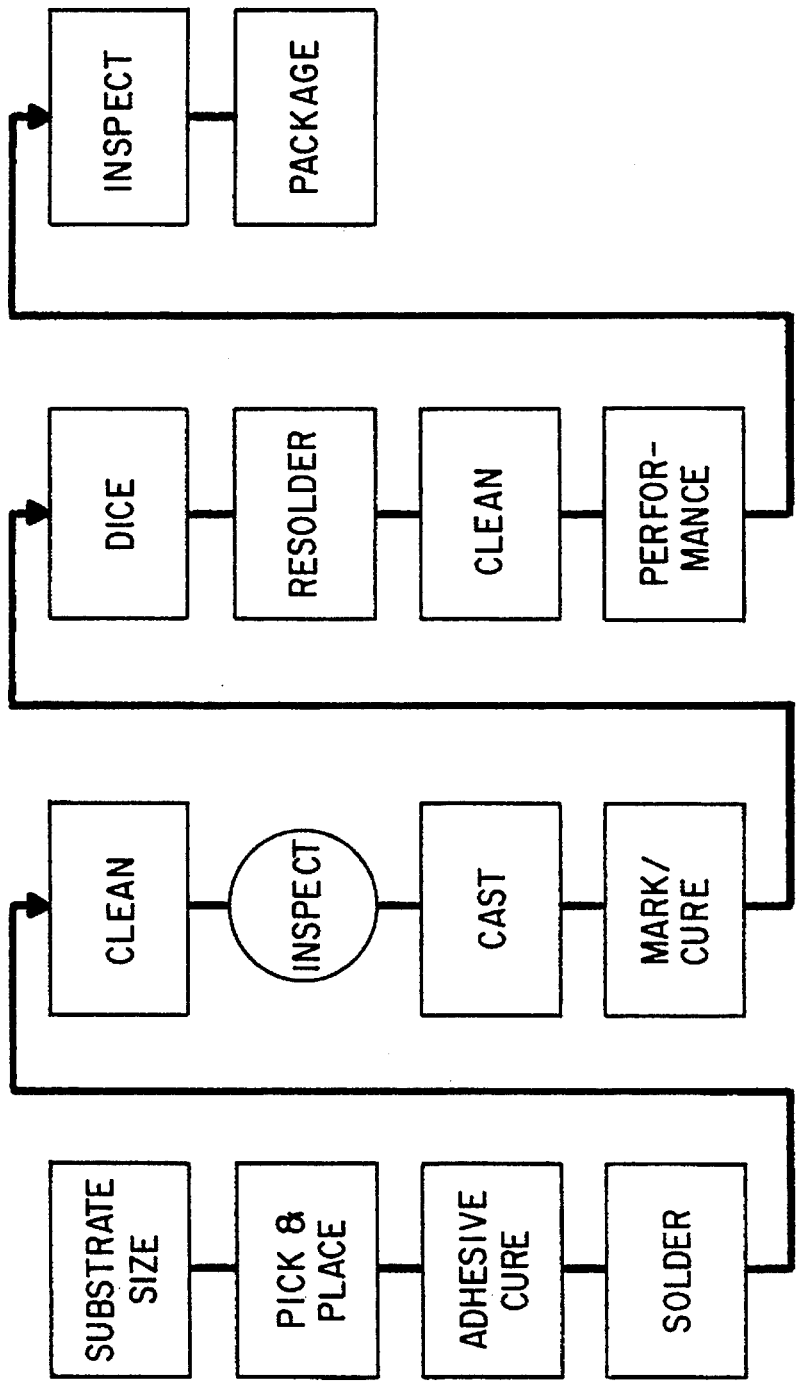
FIG. 5 is a flow chart of the assembly process.

Referring to FIG. 1 a perspective drawing is shown in cutaway and exploded assembly of a partially processed and partially populated resin impregnated substrate 2 of the invention. When completed and diced to size, the populated substrate 2 forms a number of discrete circuit components 4. FIGS. 2 through 4 show detailed views of a particular surface mount, resistive-capacitive termination circuit component 4 constructed from the substrate 2. The components 4 find application in the assembly of high frequency digital switching assemblies. FIG. 5 shows the processing steps performed to construct the components 4.

Figure 6:
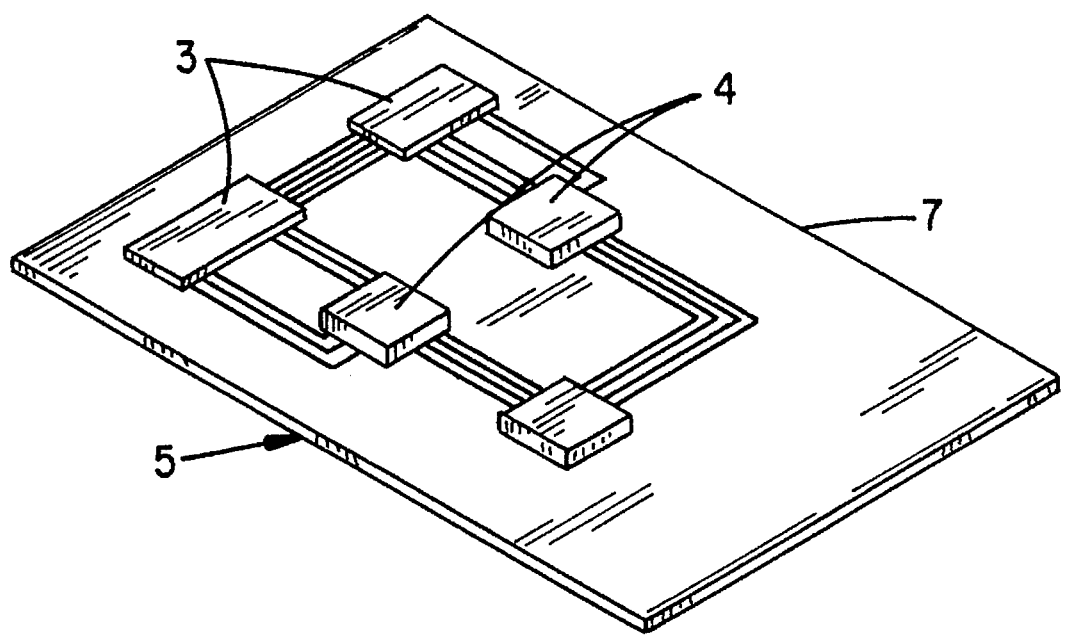
FIG. 6 is a perspective drawing of a higher level PC assembly which includes the termination device of FIG. 2.

Each component 4 provides timing compensation for integrated circuits 3 of higher complexity which are populated about a larger scale printed circuit assembly 5, reference FIG. 6. Each component 4 as constructed at FIGS. 1 through 4 is configured in a surface mount, dual-in-line package (DIP) arrangement. The width and pitch spacings of the component terminations can be arranged to other desired configurations, for example, to align to the conductive paths of the larger, more complex printed circuit assembly 5 at FIG. 6. A particular advantage of each component 4 is that the TCE of the substrate of each component 4 is matched to the substrate 7 of the assembly 5.

Each component 4 includes a resin impregnated substrate 2 that is populated with a number of monolithic capacitors 6 and resistors 8. The substrate 2 is selected to closely match the material and TCE of the printed circuit substrate 7. The components 4 and assembly 5 therefore do not exhibit a TCE differential and the assembly 5 is less susceptible to differing degrees of thermal expansion/contraction at the couplings between the components and the substrate 7 with dynamic thermal changes. Cracks and malfunctions are thereby prevented at the components 4 and overall assembly 5.

With attention to FIGS. 1 to 5, a polyimide impregnated glass fiber substrate material is used as the substrate 2. Such materials are commonly used to form conventional PC boards. Other suitable materials might comprise an FR4, G10, general epoxy and glass fiber substrate system or a PY260 substrate system of a specific polyimide and glass fiber. Numerous other substrate materials will also be apparent to those skilled in the PC assembly arts.

In a preferred construction, the substrate exhibits a nominal thickness on the order of 0.35 mm. Such a substrate 2 presents a TCE on the order 12.5 ppm/C in the X grain direction and 13.0 ppm/C in the Y grain direction. For a nominal 100 mm square substrate 2 having a pitch spacings of 1.27 mm and line widths of 0.6 mm, approximately 136 of the components 4 can be constructed from a single substrate 2.

The substrate 2 is clad in conventional fashion on its upper and lower surfaces with laminated sheets of copper foil. Depending upon the type of component being constructed, the copper foil is processed using conventional photolithography and etching techniques to a preferred pattern of terminations and conductive paths. A number of termination pads 10 and 12 are particularly formed at an upper surface 14 and a number of pads 16 are formed at a lower surface 18. The termination pads 12 and 16 are sized to be approximately twice the size of the termination pads 10. The termination pads 12 and 16 are also vertically aligned to one another and provided with drilled through holes or vias 20 which extend completely through the substrate 2. The vias 20 are also solder plated to electrically connect the termination pads 12 and 16.

Upon complementing the substrate 2 with appropriately positioned and sized termination pads 10, 12 and 16, striped regions of an epoxy adhesive 19 are applied to the surface 14. Pick-and-place equipment next populates the substrate 2 with monolithic thin film on ceramic capacitors 6 and resistors 8. The capacitors and resistors 6, 8 are sized to approximately 2.0 mm×1.2 mm and the ceramic substrate is selected to exhibit a TCE of 4 to 8 ppm/C. Depending upon the device, a variety of types and differing complexity hybrid circuit components can be populated to the substrate 2.

The populated substrate 2 is subjected to a controlled thermal environment to cure the epoxy adhesive 19 and bind the capacitors and resistors 6, 8 to the substrate 2. Each circuit component is next soldered to the substrate and at which time the plated vias 20 are also solder filled. An Ag/Sn/Pb 1.5/3.5/95% solder is applied using conventional solder techniques. A hot flux cleaning is performed to clean the substrate 2.

Preferably a "high temp" solder is used to plate and fill the vias 20 and which solder will not reflow during the soldering of the PC assembly 5. Another typical solder used to this end is a 5/95 alloy solder having a liquidus of 318 degrees Celsius. The melting point of such a solder is sufficiently higher than the typical 60/40 Sn/Pb attachment solder, which commonly has a liquidus on the order of 180 to 190 degrees Celsius, to prevent reflow during the assembly process. Filling the vias 20 with high temperature solder also makes the resulting terminations at the pads 12, 16 and bumps 30 more mechanically and electrically robust.

The populated substrate 2 is next coated with a low stress liquid epoxy 24. The epoxy 24 is selected to exhibit a TCE of less than 22 ppm/C. The epoxy 24 is applied as the substrate is retained in a casting die, which supports the substrate 2 until the epoxy cools. The epoxy 24 is applied to a depth sufficient to cover the surface 14 and the circuit components 6, 8. The soldered termination or pads 16 at the bottom surface 18 are left exposed.

A substrate 2 having a camber of less than 0.025 mm across the entire epoxy coated surface 14 is thereby obtained. Preferably, the substrate 2 exhibits as little a bound camber as possible to further minimize the likelihood of thermal stress at the completed PC assembly 5.

With the removal of the substrate 2 from the casting die, a series of dicing steps are performed to cut the substrate at horizontal and vertical dice lines 26, 28 to proper component size. The horizontal dice lines 26 are selected to bisect the oversize termination pads 12, 16. The vertical cut lines 28 occur in provided spaces between the termination pads 10, 12, and 16. The dice lines 26, 28 can occur at any preferred location, including other aligned, and/or oversized termination pads which facilitate circuit construction. The specific dimensions and placement of the cut lines 26, 28 will depend upon the component being constructed. For the components 4, a conventional DIP configured construction is obtained.

The diced components 4 are next subjected to a conventional solder operation to form solder bumps 30 at each of the termination pads 16. The bumps 30 facilitate the surface mounting of the components 4 to the assembly 5. A surface mounting avoids inherent electrical deficiencies of conventional termination leads and is preferred for high frequency assemblies 5. It is to be appreciated, however, that the components 4 can be constructed to include other types of terminations, e.g. conventional lead frames, gull wing leads etc., compatible with other circuit assemblies 5.

Exposed terminations 32, which comprise portions of each of the filled vias 20, are also provided at the peripheral edges of each component 4. The exposed terminations 32 facilitate inspection and testing of each component 4 upon eventual mounting of each component 4 to a PC assembly 5.

Although specific circuit components 4 are disclosed, it is to be appreciated a variety of other conductive and nonconductive path and termination pad arrangements and types of discrete and hybrid devices can be provided at one or both of the surfaces 14 and 18. The resulting circuit components can be constructed as discrete elements, hybrid assemblies, thick film or thin film assemblies or integrated assemblies. Multiple substrates 2 may also be stacked upon one another. Each substrate 2 may include varieties of arrangements of termination pads and patterned nonconductive regions and conductive paths formed from foil conductors laminated or deposited to each substrate 2. The substrates 2 and 5 can be selected from a variety of materials, including various ceramics, resin based and impregnated PC board materials or any other conventional circuit support material. The devices may also accommodate solder, wire or conductive epoxy bonding.

Figure 7:
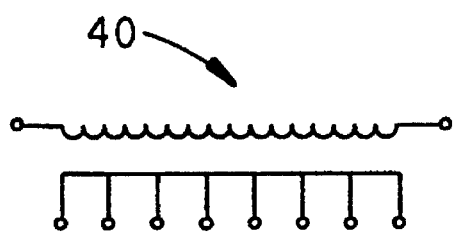
FIG. 7 is a diagram of a delay line component.
Figure 8:
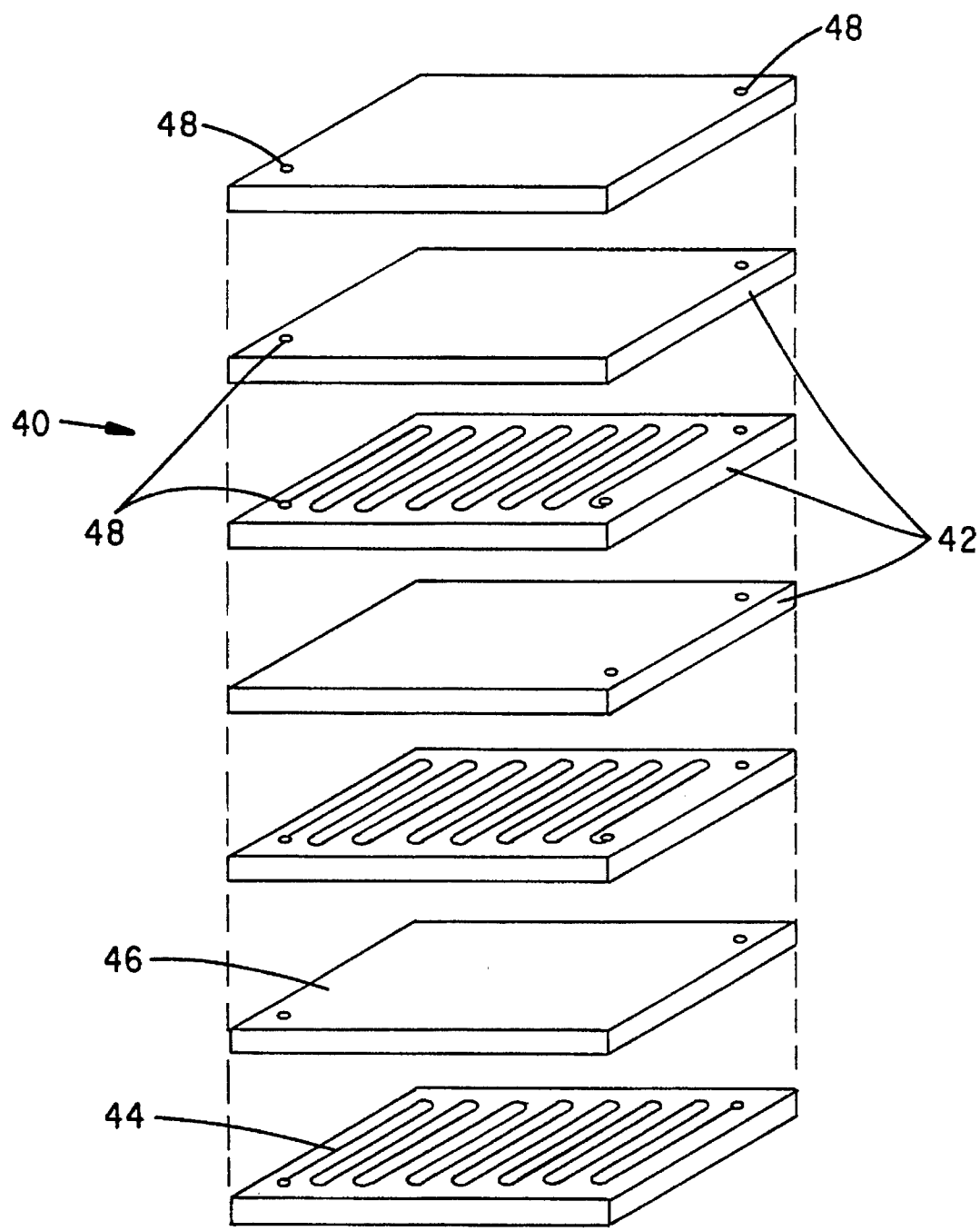
FIG. 8 is a perspective drawing of a multi-layer construction of the component of FIG. 7.
Figure 9:
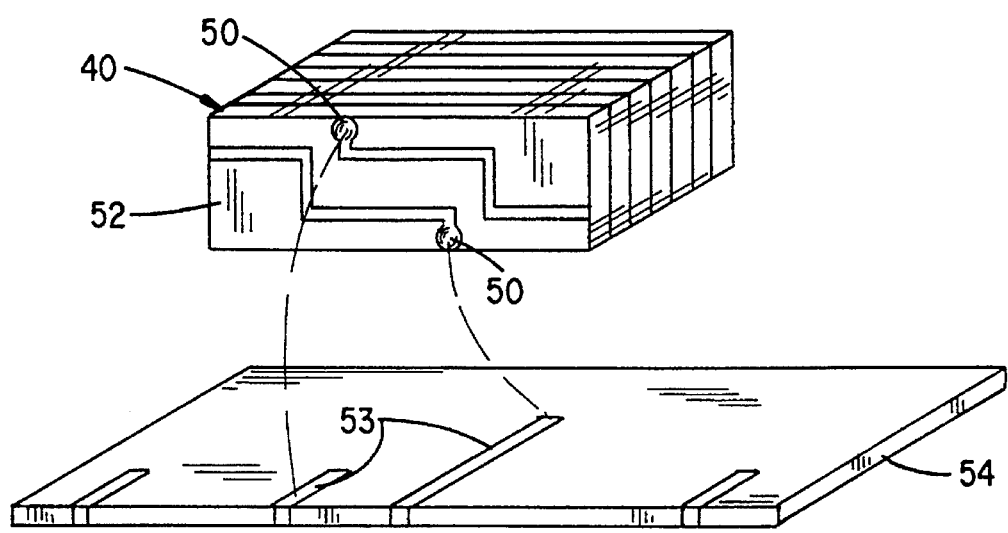
FIG. 9 is a perspective drawing shown in exploded assembly of the mounting of the component of FIG. 7 to a higher level substrate.

Turning attention to FIGS. 7, 8 and 9, views are shown of a multi-layered delay line component 40 that is configured in a surface mount package. The delay line 40 is configured of a number of ceramic substrates or layers 42 which include deposited conductive paths 44, intervening conductive ground planes 46, blank surfaces (not shown) which face the conductive paths 44, and solder filled through vias 48. Upon stacking the layers 42 and re-flowing overlapping ones of the soldered vias 48 and surfaces, the internal electrical connections are made between the layers 42 to form the circuit of FIG. 7.

Solder bump terminations 50 are formed at the bottom surface 52 of the ultimate component package. The terminations 50 are positioned and located to minimize potential thermal expansion/contraction problems at the interface to a higher level substrate 54 to which the component 40 is secured. The terminations 50 may be substantially concentrated at the center of the component 40 to align with mating conductive paths 53 at the substrate 54. Flexion difficulties can arise at the interface between the component 40 and substrate 54 interface due to the compounded amounts of heat generated by the multiple layers 42. The problem is less significant between the layers 42, which are relatively small.

Even though the TCE of the layers 42 and substrate 54 are substantially matched, by concentrating the terminations 50 at a preferential location, e.g. the approximate midpoint, on the surface 52, the left and right ends of the component 40 are permitted to flex with respect to the substrate 54. The likelihood of defects or circuit malfunction arising at the component 40 and substrate 54 interface is thereby reduced.

Figure 10:
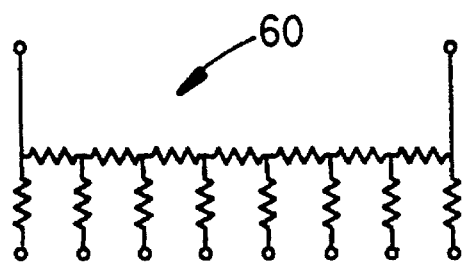
FIG. 10 is a schematic diagram of a resistive ladder network component.

FIG. 10 lastly depicts a resistive ladder network 60 which can be constructed in a multi-layer arrangement of a number of thermally matched and re-soldered layers, similar to those used to construct the delay line 40. Appropriate terminations can be effected at exposed surface terminations in the manner of the above-described devices to permit proper coupling to a higher level substrate such as the substrate 54.

While the invention has been described with respect to a number of presently preferred circuit components and assembly constructions, it is to be appreciated still other constructions may be suggested to those skilled in the art. The scope of the invention should therefore be construed broadly within the spirit and scope of the following claims.

What is claimed is:

1. A circuit assembly comprising:

a) a first substrate having a first coefficient of thermal expansion (TCE), wherein said first substrate includes a plurality of first conductive regions; and b) a plurality of components, wherein each component comprises a second substrate having a second TCE substantially equal to the first TCE, wherein said second substrate includes a plurality of second and third conductive regions at respective top and bottom surfaces of said second substrate, wherein a plurality of dissected bores extend through said second substrate between said second and third conductive regions at peripheral edges of said components, wherein said bores are filled with a first solder, wherein bump terminations of a second solder having a flow temperature less than the first solder project from said bores at the third regions, wherein a circuit device is soldered to said second and third conductive regions, and wherein each of said components is encapsulated in an epoxy encapsulant, except at said terminations, which terminations surface bond to said first first conductive regions.

2. Apparatus as set forth in claim 1 wherein a plurality of circuit devices are soldered to said second and third conductive regions.

3. Apparatus as set forth in claim 2 wherein said circuit devices comprise a plurality of hybrid components.

4. Apparatus as set forth in claim 1 wherein a bore of at least one component is exposed through said encapsulant at a sidewall of the one of said components.

5. Apparatus as set forth in claim 3 wherein at least one of said circuit devices comprises a plurality of layers of the second substrate material, wherein each layer includes at least one through bore backfilled with said first solder and wherein one of said bores at each of said layers is aligned and bonded to the bore of an adjacent layer such that each layer is electrically coupled to each other layer.

6. Apparatus as set forth in claim 4 wherein said first and second substrates comprises a ceramic material.

7. Apparatus as set forth in claim 4 wherein said first and second substrates are selected from a class including a resin impregnated, glass material; a polymer, glass material; and a ceramic material.

8. Apparatus as set forth in claim 4 wherein said encapsulant is selected to have a TCE substantially equal to the first TCE.

9. A circuit component for mounting to a first substrate of a circuit assembly comprising:
   a) a second substrate selected to exhibit a second thermal coefficient of expansion (TCE) substantially equal to the TCE of the first substrate; and
   b) a plurality of patterned first and second conductive regions at top and bottom surfaces of said second substrate, wherein a plurality of dissected bores extend through said second substrate between said first and second regions at peripheral edges of said second substrate, wherein said bores are filled with a first solder, wherein terminations of a second solder having a flow temperature less than the first solder extend from said bores at the third regions, wherein a circuit device is soldered to said first and second conductive regions, wherein said component is encapsulated in an epoxy encapsulant, except at said terminations, and which terminations are exposed through said encapsulant and bonded to said first substrate, wherein said encapsulant has a TCE substantially equal to said second TCE, and wherein at least one of said bores is exposed through said encapsulant at a sidewall of said first substrate.

10. Apparatus as set forth in claim 9 wherein said first and second substrates are selected from a class including a resin impregnated, glass material; a polymer, glass material; and a ceramic material.

11. Apparatus as set forth in claim 10 wherein said circuit device comprises a plurality of layers of said second substrate material, wherein each layer includes at least one through bore backfilled with said first solder and wherein one of said bores at each of said layers is aligned and bonded to the bore of an adjacent layer such that each layer is electrically coupled to each other layer.

12. A circuit component comprising a plurality of patterned first and second conductive regions at top and bottom surfaces of a support substrate, wherein a plurality of dissected bores extend through said first substrate at peripheral edges of said first substrate and electrically connect to conductive regions distributed about said support substrate, wherein said bores are filled with a solder, wherein terminations of a second solder having a flow temperature greater than the first solder extend from said bores, and wherein said component is encapsulated in an epoxy encapsulant except at said terminations and at a sidewall region of said support substrate aligned to one of said bores.

13. A circuit component as set forth in claim 12 wherein said first substrate is selected to have a first thermal coefficient of expansion (TCE) substantially equal to a second TCE of a second substrate to which the component is electrically coupled.

* * * * *